(12) United States Patent
Amatatsu et al.

(10) Patent No.: US 8,076,781 B2
(45) Date of Patent: Dec. 13, 2011

(54) SEMICONDUCTOR DEVICE AND MANUFACTURING METHOD OF THE SAME

(75) Inventors: Yoshimasa Amatatsu, Gunma (JP); Minoru Akaishi, Gunma (JP); Satoshi Onai, Gunma (JP); Katsuya Okabe, Gunma (JP); Yoshiaki Sano, Tochigi (JP); Akira Yamane, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 748 days.

(21) Appl. No.: 12/081,487

(22) Filed: Apr. 16, 2008

(65) Prior Publication Data

US 2008/0258301 A1 Oct. 23, 2008

(30) Foreign Application Priority Data

Apr. 17, 2007 (JP) ................................. 2007-108548

(51) Int. Cl.
 *H01L 29/43* (2006.01)
(52) U.S. Cl. ........ 257/771; 257/734; 257/766; 257/768; 257/E23.145; 257/E23.152
(58) Field of Classification Search .................. 257/734, 257/750, 751, 752, 753, 757, 758, 762, 763, 257/765, 766, 768, 771, E23.001, E23.017, 257/E23.145, E23.151, E23.152, E23.158, 257/E2, 3.161
See application file for complete search history.

(56) References Cited

U.S. PATENT DOCUMENTS

| | | | | |
|---|---|---|---|---|
| 5,641,703 A | * | 6/1997 | Cohen et al. | 438/467 |
| 5,859,476 A | * | 1/1999 | Onoda | 257/775 |
| 6,297,563 B1 | * | 10/2001 | Yamaha | 257/781 |
| 6,434,819 B1 | | 8/2002 | Rokugawa | |
| 6,455,940 B2 | * | 9/2002 | Satou | 257/774 |
| 6,500,750 B1 | | 12/2002 | Shroff et al. | |
| 6,927,493 B2 | * | 8/2005 | Bojkov et al. | 257/753 |

(Continued)

FOREIGN PATENT DOCUMENTS

JP 9-219450 8/1997

(Continued)

OTHER PUBLICATIONS

Amatatsu, Y. et al., U.S. Office Action mailed Dec. 9, 2010, directed to U.S. Patent Application No. 12/053,168; 11 pages.

(Continued)

*Primary Examiner* — Evan Pert
*Assistant Examiner* — Eduardo A Rodela
(74) *Attorney, Agent, or Firm* — Morrison & Foerster LLP

(57) ABSTRACT

A conventional semiconductor device has a problem that reduction of a connection resistance value between wiring layers is difficult because of an oxide film formed between the wiring layers. In a semiconductor device of this invention, a first metal layer is embeded in opening regions which connect a first wiring layer and a second wiring layer and an opening is formed in a spin coated resin film formed on the first metal layer. In the opening, a Cr layer forming a plating metal layer and a Cu plated layer are connected to each other. With this structure, the spaces among crystal grains in portions in the Cr layer on the first metal layer are wide, which causes the portions to be coarse. In the coarse portions in the Cr layer, an alloy layer formed of the second metal layer and the Cu plated layer is formed, and thus, the connection resistance value is reduced.

9 Claims, 10 Drawing Sheets

U.S. PATENT DOCUMENTS

| | | | |
|---|---|---|---|
| 7,307,342 | B2 | 12/2007 | Jeong et al. |
| 7,545,040 | B2 * | 6/2009 | Ueki et al. .................... 257/751 |
| 7,598,612 | B2 | 10/2009 | Yuzawa |
| 2008/0001290 | A1 * | 1/2008 | Chou et al. .................... 257/751 |
| 2008/0230899 | A1 | 9/2008 | Amatatsu et al. |
| 2008/0237853 | A1 | 10/2008 | Amatatsu et al. |

FOREIGN PATENT DOCUMENTS

| | | |
|---|---|---|
| JP | 11-145171 | 5/1999 |

OTHER PUBLICATIONS

Amatatsu, et al., U.S. Office Action mailed Oct. 28, 2010, directed to U.S. Appl. No. 12/056,751; 7 pages.

Amatatsu, Y. et al., U.S. Office Action mailed Mar. 18, 2011, directed to U.S. Appl. No. 12/056,751; 7 pages.

* cited by examiner (A)

(B)

SEMICONDUCTOR DEVICE AND MANUFACTURING METHOD OF THE SAME

This application claims priority from Japanese Patent Application Number JP 2007-108548 filed on Apr. 17, 2007, the content of which is incorporated herein by reference in its entirety.

BACKGROUND OF THE INVENTION

1. Field of the Invention

The present invention relates to a semiconductor device having a reduced connection resistance value between wiring layers and a manufacturing method of the semiconductor device.

2. Description of the Related Art

As an example of a conventional manufacturing method of a semiconductor device, the following manufacturing method, shown in FIGS. 11A to 11E, has been known. As shown in FIG. 11A, a BPSG (boron phospho silicate glass) film 82 is formed on a silicon substrate 81. Subsequently, a contact hole 83 is formed in the BPSG film 82. Next, as shown in FIG. 11B, a titanium (Ti) film 84, a titanium nitride (TiN) film 85, an aluminum-silicon-copper (Al—Si—Cu) film 86, a Ti film 87 and a TiN film 88 are formed on and above the silicon substrate 81 by continuous spattering in a way they are embedded in the contact hole 83. Then, the above-described films 84 to 88 are then patterned by the use of a photolithography technique and an etching technique. Next, as shown in FIG. 11C, a plasma silicon nitride (SiN) film 89 and a TEOS film 90 are sequentially formed above the silicon substrate 81 by a plasma chemical vapor deposition (CVD) method. After an SOG film 91 is formed in the step portion, a TEOS film 92 is formed by a plasma CVD method. Next, as shown in FIG. 11D, a contact hall 93 is formed by a photolithography technique and an etching technique, having an upper portion on the Al—Si—Cu film 86 etched by 80 nm or more in depth. Next, as shown in FIG. 11E, a Ti film 94, an Al—Si—Cu film 95 and a TiN film 96 are formed above the silicon substrate 81 in a way they are embedded in the contact hole 93 and then they are patterned to form a wiring layer. (This technology is described for instance in Japanese Patent Application Publication No. Hei 9-219450, pages 3 to 5, and FIGS. 1 to 3.)

As another example of a conventional manufacturing method of a semiconductor device, the following manufacturing method, as shown in FIGS. 12A to 12F, has been known. As shown in FIG. 12A, an interlayer insulating film 102 made of silicon dioxide or the like is formed on the top surface of a silicon substrate 101. Then, as shown in FIG. 12B, an aluminum (Al) electrode pad 103 with a thickness of approximately 1.0 μm is formed on the interlayer insulating film 102. Next, as shown in FIG. 12C, a silicon nitride film 104 is formed on the interlayer insulating film 102 including the Al electrode pad 103 by a CVD method. Thereafter, as shown in FIG. 12D, an opening 105 is formed in the silicon nitride film 104 formed on the Al electrode pad 103. Next, as shown in FIG. 12E, a barrier metal film 106 is formed so as to coat the Al electrode pad 103 exposed at the opening 105. After that, as shown in FIG. 12F, a gold bump 107 is formed on the barrier metal film 106 by electrolytic plating. (This technology is described for instance in Japanese Patent Application Publication No. Hei 11-145171, pages 2 to 3, and FIG. 1.)

As described above, in the conventional manufacturing method of a semiconductor device, the contact hole 93 is formed in the plasma SiN film 89, the TEOS films 90, and 92 and so forth to connect the upper wiring layer and the lower wiring layer. At this time, the Al—Si—Cu film 86, the Ti film 87, and the TiN film 88 are etched as well, and thus, the Al—Si—Cu film 86 is exposed at the contact hole 93. In this manufacturing method, the Al—Si—Cu film 86 exposed at the contact hole 93 is oxidized, and therefore, an oxide film is formed on the exposed Al—Si—Cu film 86. As a result, the oxide film is formed in the current path between the lower and upper wiring layers, and this causes a problem that the connection resistance value between the lower and upper wiring layers is not likely to be reduced.

Further, in the conventional manufacturing method of a semiconductor, after the Al electrode pad 103 is formed on the interlayer insulating film 102, the silicon nitride film 104 serving as a passivation film is formed on the Al electrode pad 103. Then, the opening 105 is formed in the silicon nitride film 104 formed on the Al electrode pad 103, and the barrier metal film 106 is formed on the exposed Al electrode pad 103 by a sputtering method, for example. In this manufacturing method, in the step of forming the opening 105 in the silicon nitride film 104 and forming the barrier metal film 106 therein, the Al electrode pad 103 exposed at the opening 105 is oxidized to form an oxide film on the Al electrode pad 103. Thus, a current path on and above the Al electrode pad 103 is from the Al electrode pad 103 to the oxide film on the Al electrode pad 103, to the barrier metal film 106, and finally to the gold bump 107. As a result, there is a problem that the oxide film formed in the current path makes it difficult to reduce a resistance value on the Al electrode pad 103.

SUMMARY OF THE INVENTION

The present invention has been made in consideration of the above-described circumstances. A semiconductor device according to the present invention includes a first wiring layer provided on a semiconductor substrate, a first insulating layer formed to coat the first wiring layer, an opening region provided in the first insulating layer to expose the surface of the first wiring layer, a first metal layer formed to be embedded in the opening region and to be connected to the first wiring layer, a second wiring layer formed on the first insulating layer and on the first metal layer, a second insulating layer formed to coat the second wiring layer, and a third wiring layer formed to be connected to the second wiring layer through an opening formed in the second insulating layer. In the semiconductor device, the opening is provided above a formation region of the first metal layer, and an alloy layer made of metal layers composing the respective second and third wiring layers is formed in a region where the second wiring layer and the third wiring layer are connected to each other, the connecting region being positioned in the opening. Accordingly, in this invention, an alloy layer is formed in the region where the second wiring layer on the first metal layer and the third wiring layer are connected to each other. Consequently, the connection resistance value is reduced by the alloy layer.

A manufacturing method of a semiconductor device according to this invention includes the steps of forming a first wiring layer above a semiconductor substrate, forming a first insulating layer on the semiconductor substrate to coat the first wiring layer, and then forming an opening region in the first insulating layer to expose the surface of the first wiring layer, forming a first metal layer on the first insulating layer in a way to be embedded in the opening region, selectively removing the first metal layer, and then forming a second wiring layer on the first insulating layer and on the first metal layer, and forming a second insulating layer on the first insulating layer to coat the second wiring layer, forming an opening in the second insulating layer to expose the second wiring layer on the first insulating layer, and then forming a third wiring layer, so that the third wiring layer is connected to the second wiring layer being exposed at the opening in the second insulating layer. Accordingly, in this invention, above an opening region where a first and second wiring layers are connected to each other, an opening where a second and a third wiring layers are connected to each other is formed. With this manufacturing method, an alloy layer is formed in the region where the second and the third wiring layers are connected to each other. Consequently, the connection resistance value is reduced by the alloy layer.

DESCRIPTION OF THE INVENTIONS

Figure 1:
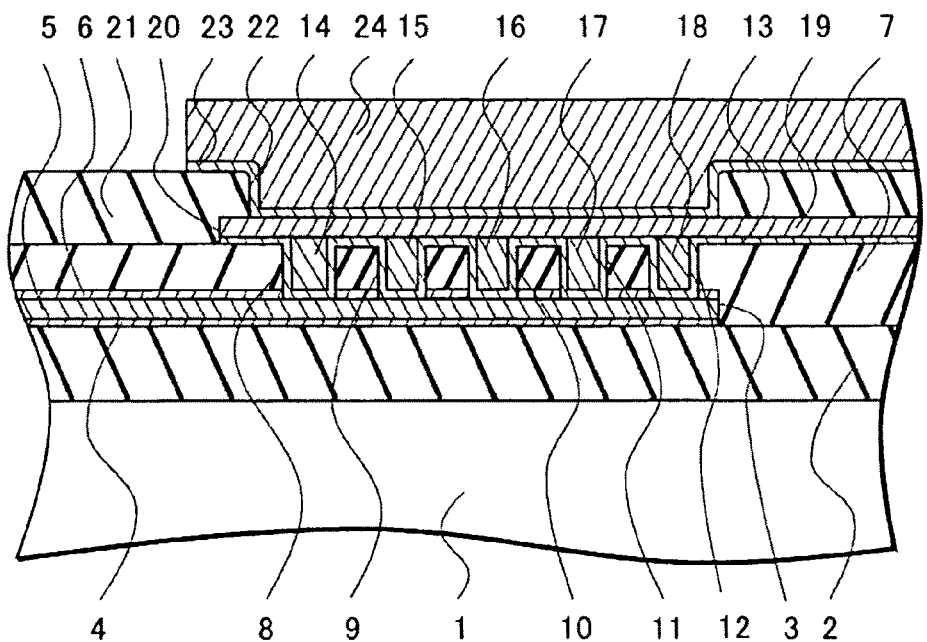
FIGS. 1A and 1B are cross-sectional views which illustrate a semiconductor device according to an embodiment of the present invention.
Figure 1:
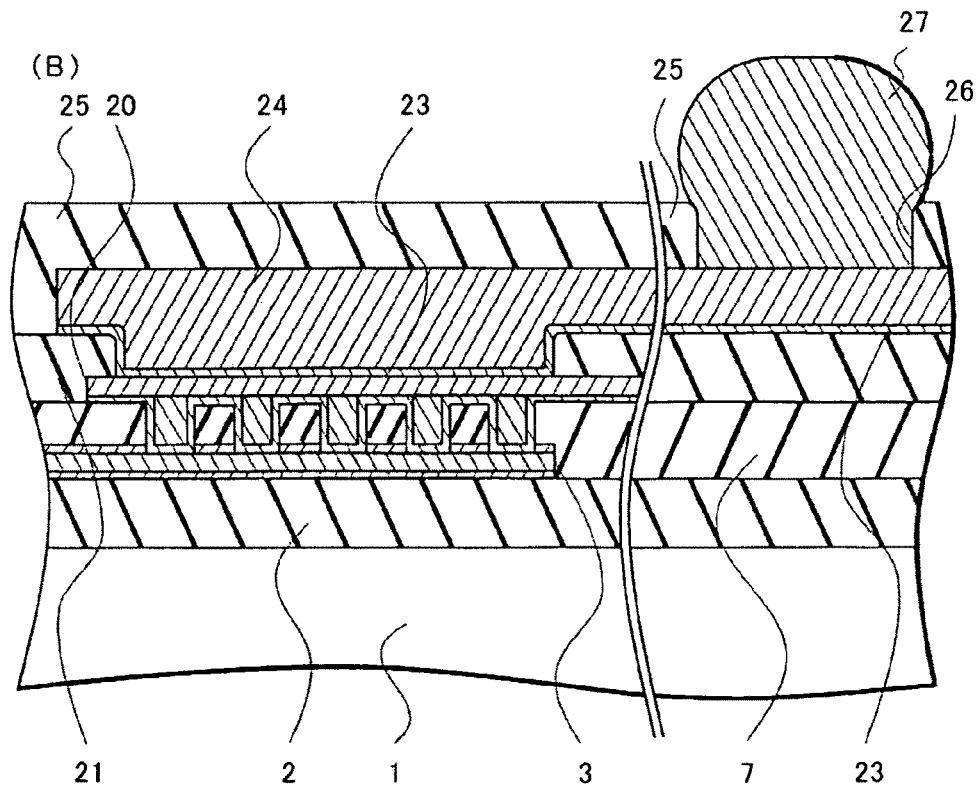
Figure 2:
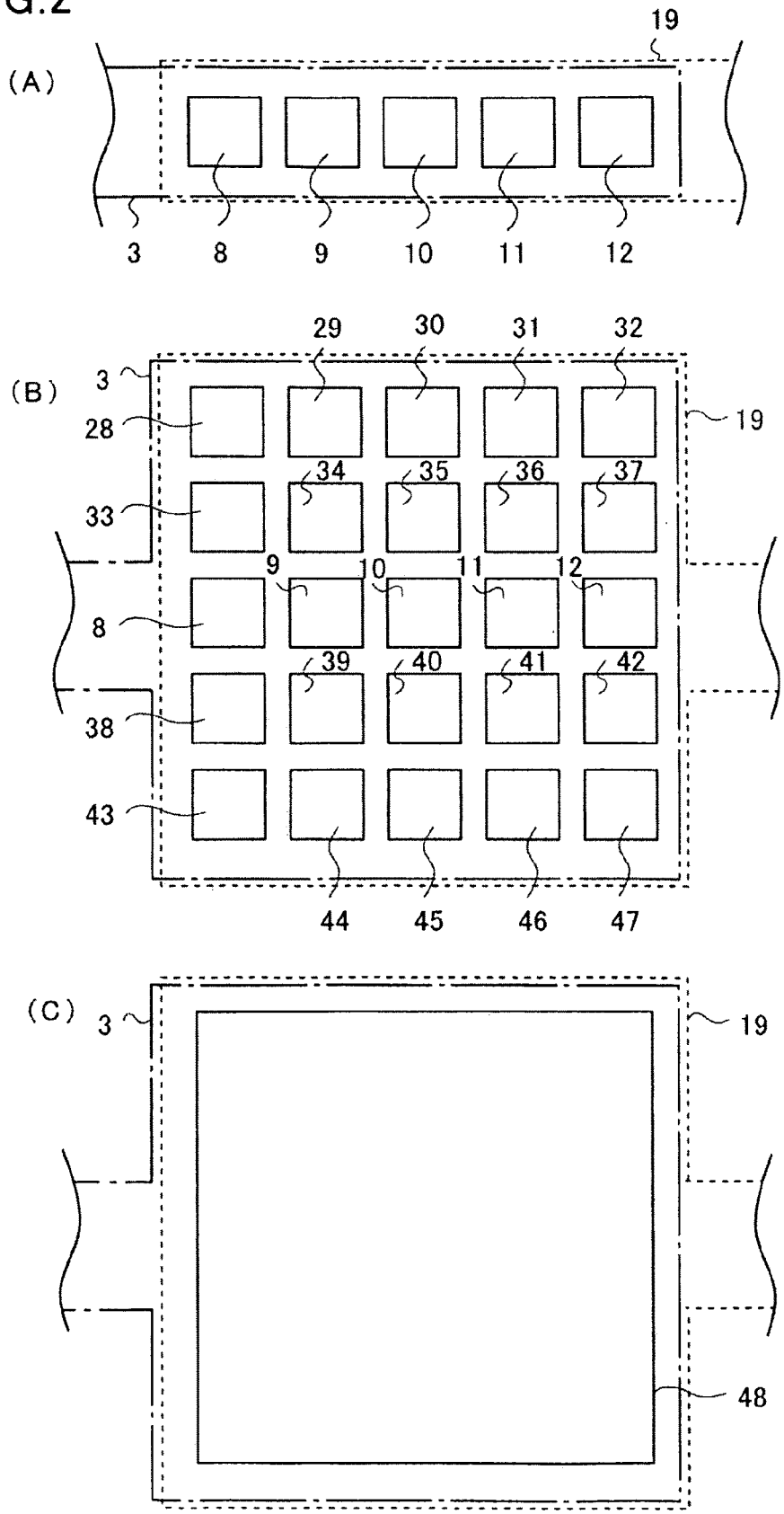
FIGS. 2A to 2C are plan views which illustrate the semiconductor device according to the embodiment of the present invention.
Figure 3:
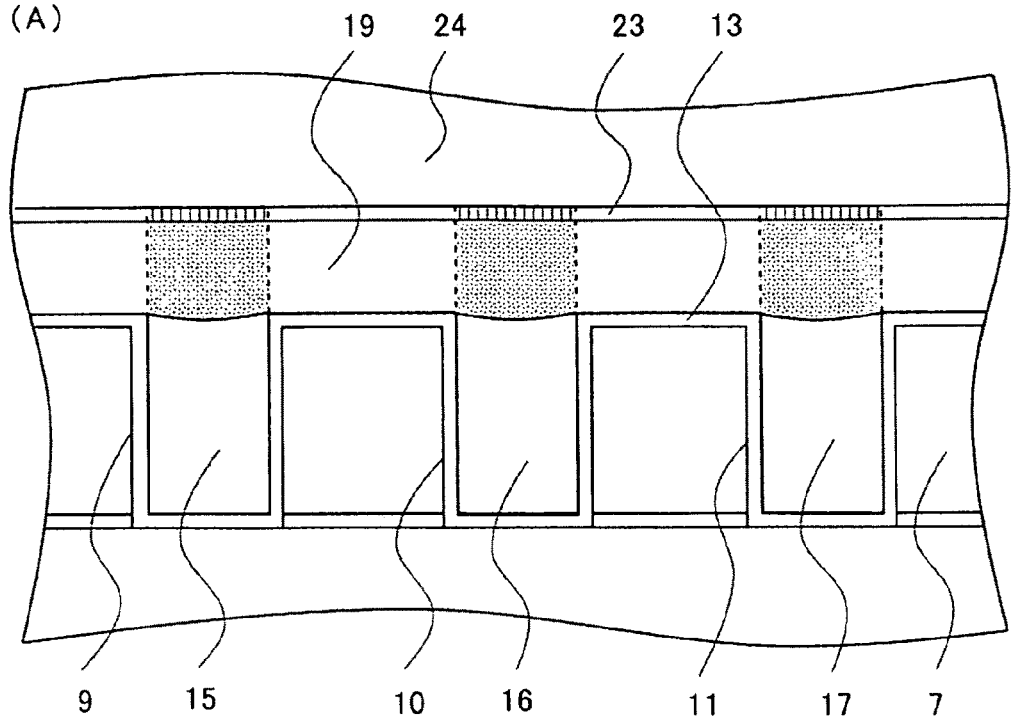
FIGS. 3A and 3B are cross-sectional views which illustrate the semiconductor device according to the embodiment of the present invention.
Figure 3:
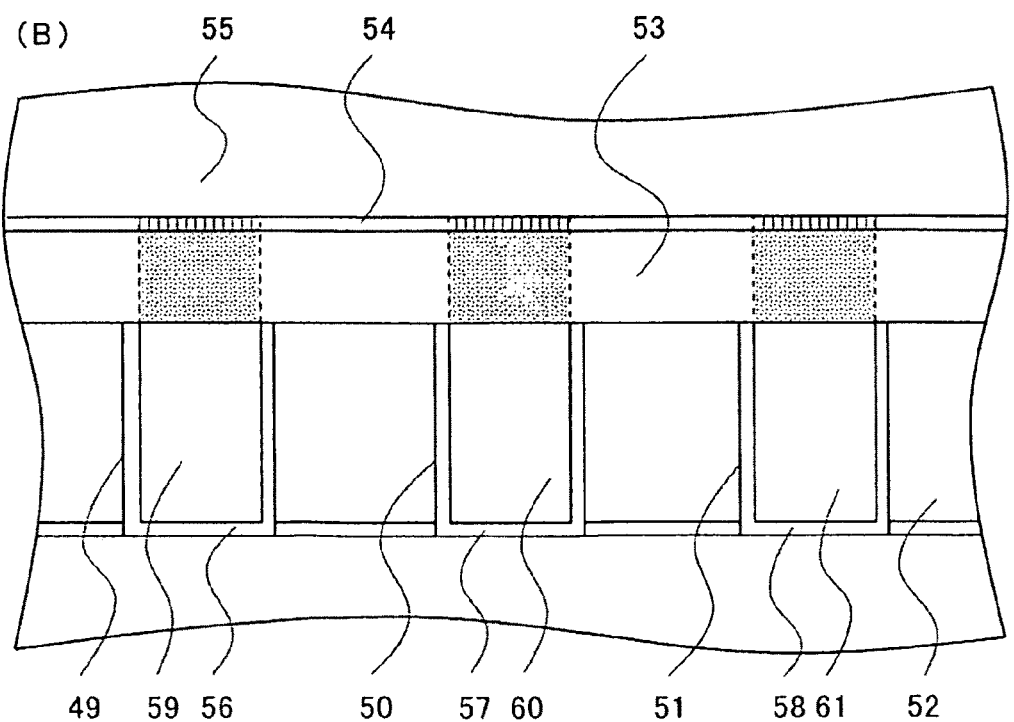
Figure 4:
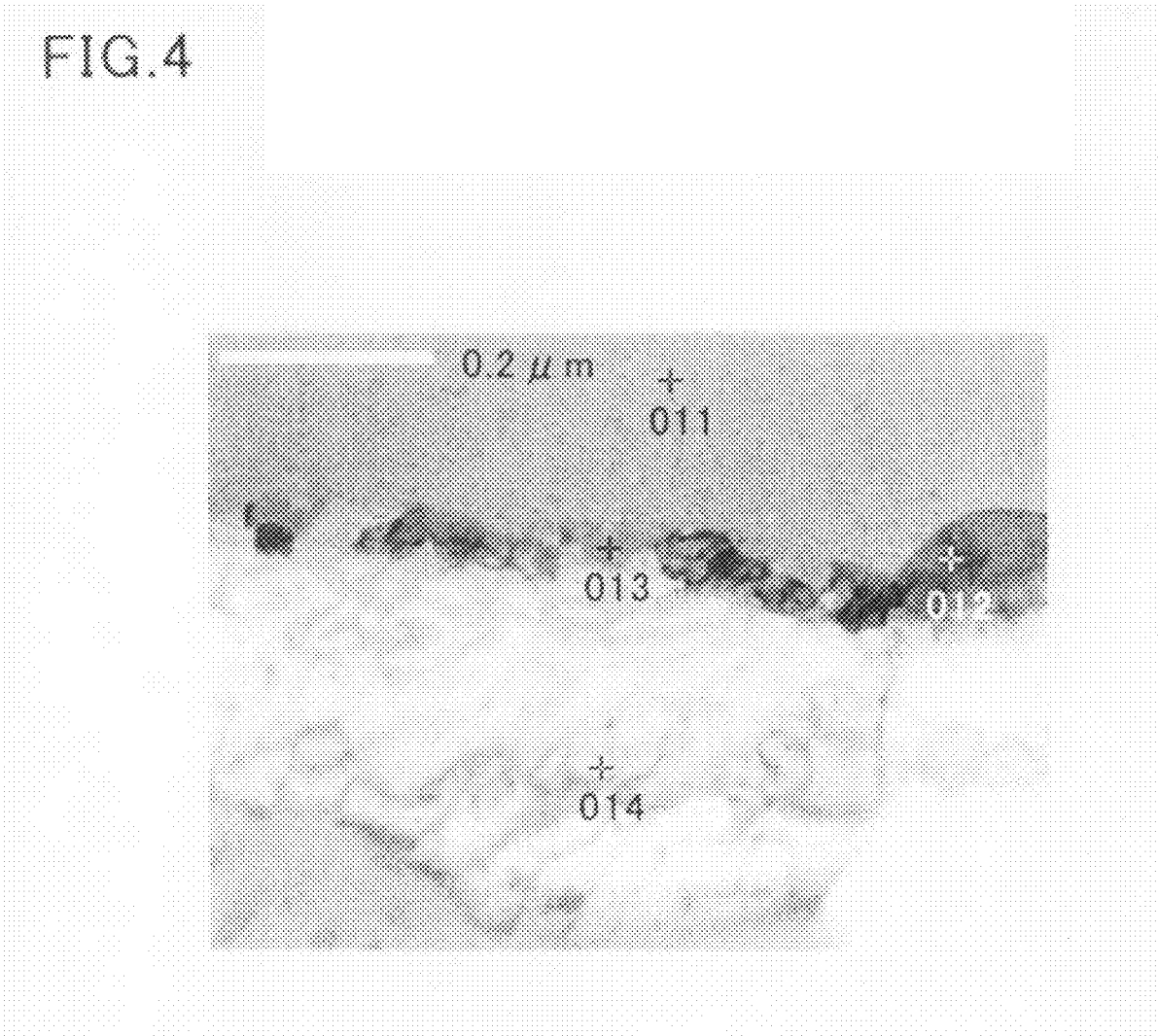
FIG. 4 is an analysis picture of TEM which shows a region where metals react with each other in the semiconductor device according to the embodiment of the present invention.
Figure 5:
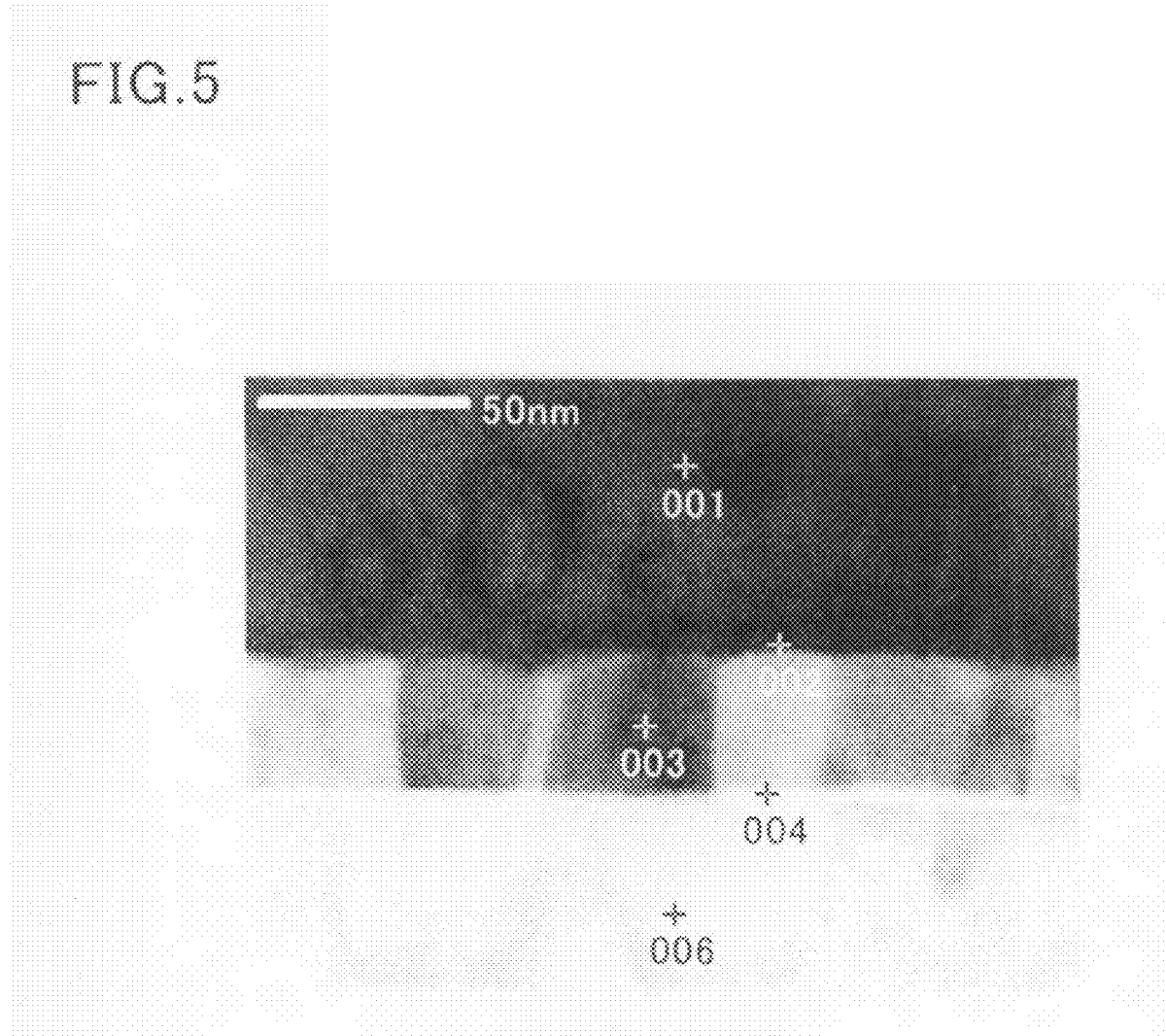
FIG. 5 is an analysis picture of TEM which shows a region where metals do not react with each other in the semiconductor device according to the embodiment of the present invention.

With reference to FIGS. 1 to 5, a semiconductor device according to a first embodiment of the present invention will be described in detail below. FIG. 1A is a cross-sectional view which illustrates a semiconductor device according to an embodiment of the present invention. FIG. 1B is another cross-sectional view which illustrates a semiconductor device according to the embodiment. FIGS. 2A to 2C are plan views which illustrate an opening region in the semiconductor device according to the embodiment. FIGS. 3A and 3B are cross-sectional views which illustrate a structure of the opening region in the semiconductor device according to the embodiment. FIG. 4 is an analysis picture of TEM which shows a region where metals react with each other. FIG. 5 is an analysis picture of TEM which shows a region where metals do not react with each other.

As shown in FIG. 1A, an insulating layer 2 for insulating a silicon substrate 1 is formed on the silicon substrate 1. The insulating layer 2 is formed of at least from a silicon oxide film, a nondoped silicate glass (NSG) film or a boron phospho silicate glass (BPSG) film, for example. Here, by the formation of the insulating layer 2 on the silicon substrate 1, the top surface of the silicon substrate 1 is insulated. Moreover, a single crystal substrate or an epitaxial layer formed on a single crystal substrate can be used as the silicon substrate 1. Alternatively, a compound semiconductor substrate can be used as the silicon substrate 1.

A first wiring layer 3 is formed on the insulating layer 2. The first wiring layer 3 includes a metal film 5 formed on a barrier metal film 4 and an antireflection coating 6 formed on the metal film 5. The barrier metal film 4 is made of refractory metal such as titanium (Ti) or titanium nitride (TiN), for example. The metal film 5 is formed of, for example, an aluminum (Al) film or an mainly-aluminous alloy film, at least one component of which is selected from an aluminum-silicon (Al—Si) film, an aluminum-silicon-copper (Al—Si—Cu) film, an aluminum-copper (Al—Cu) film, and the like. The antireflection coating 6 is made of refractory metal such as TiN or titanium tungsten (TiW), for example. The film thickness of the first wiring layer 3 is, for example, 0.4 to 3.0 µm.

A first insulating layer 7 is formed on the top surface of the insulating layer 2 and the first wiring layer 3. The first insulating layer 7 is formed of at least from a silicon oxide film or a tetra-ethyl-ortho-silicate (TEOS) film, for example.

Opening regions 8 to 12 are formed in the antireflection coating 6 and in the first insulating layer 7. The opening regions 8 to 12 are formed in the antireflection coating 6 and the first insulating layer 7 above the first wiring layer 3 by a photolithography technique and dry etching with the use of, for example, $CHF_3$ or $CF_4$ gas.

A barrier metal film 13 is formed on the top surface of the first insulating layer 7 including the opening regions 8 to 12. The barrier metal film 13 is made of refractory metal such as Ti or TiN, for example. The barrier metal film 13 is directly connected to the first wiring layer 3 in the opening regions 8 to 12.

First metal layers 14 to 18 are embedded in the opening regions 8 to 12. The first metal layers 14 to 18 are formed of a tungsten (W) layer, for example, and formed by a chemical vapor deposition (CVD) method.

A second metal layer 19 is formed on the top surface of the barrier metal film 13 and the top surface of the first metal layers 14 to 18. The second metal layer 19 is formed of, for example, an Al layer or an mainly-aluminous alloy layer, at least one component of which is selected from an Al—Si film, an Al—Si—Cu film and an Al—Cu film, and the like. The second metal layer 19 and the barrier metal film 13 form a second wiring layer 20. Note that, although not illustrated, an antireflection coating made of refractory metal such as TiN or TiW, for example, may be formed on a portion on the top surface of the second metal layer 19, the portion being not exposed at an opening 22,.

A spin coated resin film 21 is formed on the top surface of the first insulating layer 7 as well as on the second wiring layer 20. The spin coated resin film 21 is a second insulating layer and made of a polybenzoxazole (PBO) film or a polyimide resin film, or the like. The PBO film is photosensitive resin, and has properties such as high heat resistance, high mechanical characteristics and a low dielectric. In addition, the PBO film prevents deterioration of semiconductor element caused by the external environment such as moisture, and thereby stabilizes the surface of the semiconductor element.

Above the region where the opening regions 8 to 12 described above are formed, the opening 22 is formed in the spin coated resin film 21 on the second metal layer 19. The opening 22 is formed by a photolithography technique and wet etching, for example. The opening 22 has a wide open shape so as to form an opening above the region where the opening regions 8 to 12 are formed. Moreover, the second metal layer 19 is exposed at the opening 22.

A plating metal layer 23 is formed on the top surface of the spin coated resin film 21 as well as in the opening 22. The plating metal layer 23 is directly connected to the second metal layer 19 in the opening 22.

Two types of films are stacked to form the plating metal layer 23. A first film is a refractory metal film—e.g. a chrome (Cr) layer, a titanium (Ti) layer, or a titanium tungsten (TiW) layer-is formed by a sputtering method. The first film is used as a seed layer for forming a plating layer on the plating metal layer 23. Moreover, on the first film, a Cu layer or a nickel (Ni) layer is formed as a second film by a sputtering method, for example. A second film is used as a seed for forming a plating layer on the plating metal layer 23. In a case where the PBO film is used as the spin coated resin film 21, for example, by the use of a Cr layer as the plating metal layer 23, the adhesion between the PBO film and the Cr layer, and the adhesion between the Cr layer and the Cu plated layer 24 improves the adhesion between the PBO film and a Cu plated layer 24.

Subsequently, the Cu plated layer 24 is formed on the top surface of the plating metal layer 23 by, for example, electrolytic plating. When the Cu plated layer 24 is to be formed, the Cu layer is used as the plating metal layer 23.

Meanwhile, when a gold (Au) plated layer, instead of the Cu plated layer 24, is to be formed, an Ni layer, instead of the Cu layer, is used as the plating metal layer 23.

Note that FIG. 1A shows the case where the Cu layer is formed as the plating metal layer 23 and the Cu plated layer 24 is formed on the top surface of the Cu layer. Since the Cu layer formed as the plating metal layer 23 is practically transformed into the Cu plated layer 24 by electrolytic plating, the Cu layer is integrally shown with the Cu plated layer 24 in FIG. 1A. In addition, instead of the Cu plated layer 24, a bump electrode made of, for example, Au or solder may be formed on the plating metal layer 23.

Although not illustrated, a shield layer may be formed on the top surface of the second wiring layer 20. The shield layer is formed of a silicon nitride (SiN) film, for example. The shield layer prevents ingress of water to the insulating layers 2 and 7, and also prevents corrosion of the wiring layer and the like. When the shield layer is formed, the shield layer in the opening 22 is removed, so that the second metal layer 19 is exposed at the opening 22.

FIG. 1B shows a structure in which the bump electrode is formed in the structure shown in FIG. 1A. Accordingly, the same structure members are denoted by the same reference numerals. Only different structure members are explained, and the explanations for the same structure members are omitted. Note that FIG. 1B shows the structure in which the plating metal layer 23 and the Cu plated layer 24 are used as the wiring layer, and the bump electrode is formed on the Cu plated layer 24 which is laid over in a desired area.

As shown in FIG. 1B, a PBO film 25 is first formed on the surface of the structure shown in FIG. 1A. Subsequently, an opening 26 is formed in the PBO film 25 on the Cu plated layer 24, a part of which is exposed at the opening 26.

Next, a bump electrode 27 is formed in connection with the Cu plated layer 24 through the opening 26. The bump electrode 27 is formed of, for example, Cu, Au, and solder in this order from the lower layer.

In the structure shown in FIG. 1B, the Cu plated layer 24 may be used as a wiring layer which electrically connects the Cu plated layer 24 with the region where a semiconductor element is formed. Thus, the use of the Cu wiring layer reduces a wiring resistance value compared to the case where an Al wiring layer is used. Specifically, the sheet resistance values of the Cu wiring layer and the Al wiring layer are approximately 2.0 μΩ·cm and 3.0 μΩ·cm, respectively. Moreover, the Cu plated layer 24 as the wiring layer is formed by electrolytic plating to have a film thickness of approximately 10.0 μm. Meanwhile, the Al wiring layer is formed by a sputtering method to have a film thickness of approximately 2.0 to 3.0 μm. In sum, by the use of the Cu plated layer 24 as the wiring layer, the wiring resistance value is reduced because of the film thickness.

FIG. 2A shows the multiple opening regions 8 to 12 formed on the first insulating layer 7 below the second metal layer 19 which forms the second wiring layer 20. Note that the solid line shows the opening regions 8 to 12 formed in the first insulating layer 7 and the dotted line shows the second metal layer 19 and the alternate long and short dash line shows the first wiring layer 3.

As shown in FIG. 2A, the opening regions 8 to 12 are formed in the first insulating layer 7 which is in a region where the first wiring layer 3 and the second metal layer 19 are overlapped in the planar view. As described above, the first metal layer 14 to 18 (see FIG. 1A) is embedded in the opening regions 8 to 12, and thus, the first wiring layer 3 and the second wiring layer 20 are electrically connected to each other. Further, each of the opening regions 8 to 12 has a square shape with a length of 0.5 to 20.0 μm on each side, for example. Although the detail will be described later, because of the enhancement of the region where the second metal layer 19 is formed directly on the first metal layer 14 to 18, a connection resistance value between the second wiring layer 20 and the Cu plated layer 24 above the opening regions 8 to 12 is reduced. Note that the opening shape of the opening regions 8 to 12 is not necessarily a square shape and may be various shapes such as a triangular shape and a circular shape.

As shown in FIG. 2B, when the region where the first wiring layer 3 and the second metal layer 19 are overlapped in the planar view is given wider than the line width of the wiring pattern, the shape may be a square shape, for example. The opening regions 8 to 12 and 28 to 47 may be formed in the first insulating layer 7 positioned in the above-described overlapped region. Further, the opening regions 8 to 12 and 28 to 47 are formed to be a checkered pattern in the first insulating layer 7 in the above-described overlapped region. Here, the checkered pattern means a pattern where the opening regions 8 to 12 and 28 to 47 are positioned like islands and arranged in a matrix form. Moreover, the first insulating layer 7 is formed in a lattice pattern so as to surround the opening regions 8 to 12 and 28 to 47. Note that, although the detail will be described later, because of the enhancement of the region where the W layer (i.e. the first metal layer) is embedded, a connection resistance value between the second wiring layer 20 and the Cu plated layer 24 above the opening regions 8 to 12 and 28 to 47 is considerably reduced.

Meanwhile, as shown in FIG. 2C, one opening region 48 may be formed in the first insulating layer 7 which is positioned in the region where the first wiring layer 3 and the second metal layer 19 are overlapped in the planar view. Note that, although the detail will be described later, because of the enhancement of the region where the W layer (i.e. the first metal layer) is embedded, a connection resistance value between the second wiring layer 20 and the Cu plated layer 24 above the opening region 48 is considerably reduced.

FIG. 3A shows a state of connection among the barrier metal film 13, the first metal layers 15 to 17, the second metal layer 19, the plating metal layer 23 and the Cu plated layer 24 above the opening regions 9 to 11. Note that, although not illustrated, the opening regions 8 and 12 take the same structure.

The second metal layer 19 is an Al layer or an Al alloy layer. The second metal layer 19 is deposited on the barrier metal film 13 or on the first metal layers 15 to 17 by a sputtering method, for example. The barrier metal film 13 is made of refractory metal such as Ti or TiN and formed on the top surface of the first insulating layer 7 by a sputtering method, for example. The barrier metal 13 is thought to have a columnar crystal structure. Meanwhile, the first metal layers 15 to 17 are the W layers and formed by a CVD method, for example. Further, the first metal layers 15 to 17 are thought to have a fine-grain polycrystalline structure. In other words, the first metal layers 15 to 17 are thought to have a crystal structure with a random crystal orientation.

With the structure described above, the second metal layer 19 is influenced by the crystal structure of the film below it, and thus the crystal structure of the second metal layer 19 on the barrier metal film 13 is different from that on the first metal layers 15 to 17. Specifically, in the area where hatching is not performed, namely the area on the barrier metal film 13, the second metal layer 19 has a tight crystal grain spacing. Accordingly, the crystal structure is thought to be the columnar crystal structure. On the other hand, in the area where shady hatching is performed, namely the area on the first metal layers 15 to 17, the second metal layer 19 is thought to have a crystal structure with a random crystal orientation.

Furthermore, a Cr layer forming the plating metal layer 23 is deposited on the top surface of the second metal layer 19 by a sputtering method, for example. The Cr layer is also influenced, as in the case of the second metal layer 19, by the crystal structure of the film below it. For that reason, in the area where hatching is not performed, namely the area above the barrier metal film 13, the Cr layer has a tight crystal grain spacing. Accordingly, the crystal structure is thought to be the columnar crystal structure. On the other hand, in the area where line hatching is performed, namely the area above the first metal layers 15 to 17, the Cr layer is thought to have a crystal structure with a loose crystal grain spacing and a random crystal orientation.

The Cu plated layer 24 is formed on the Cr layer having both areas-the area with a loose crystal grain spacing and the area with a tight crystal grain spacing. As described above, in the area with a loose crystal grain spacing in the Cr layer, shown by the line hatching, the spaces among the crystal grains in the Cr layer are widened to cause a portion having crystal grains present therein and a portion having no crystal grains present therein. In the area having a loose crystal grain spacing, the Cu plated layer 24 reacts with the second metal layer 19 formed of an Al layer or an Al alloy layer. This phenomenon occurs because the Cu plated layer 24 reacts well with the second metal layer (an Al layer or an Al alloy layer) 19 because of the affinity with each other.

Specifically, in the area having a loose crystal grain spacing in the Cr layer, shown by the line hatching, the crystal grains in the Cr layer do not come into close contact with each other, thereby resulting in a loose crystal grain spacing. Moreover, a subsequent step of heat treatment, for example, heat treatment in formation of the bump electrode allows the Cu plated layer 24 and the second metal layer 19, which are formed above and below the Cr layer, to flow between the crystal grains and to react with each other in the area having a loose crystal grain spacing in the Cr layer. In the metal reaction area, an alloy layer including Cu and Al is formed.

FIG. 3B shows the structure in which a metal layer 53, a plating metal layer 54 and a Cu plated layer 55 are formed above the insulating layer 52 in which opening regions 49 to 51 are formed. As shown in FIG. 3B, the opening regions 49 to 51 are filled by barrier metal films 56 to 58 and metal layers 59 to 61, and polished by a chemical mechanical polishing (CMP) method. Subsequently, a flat surface is formed by the insulating layer 52, the barrier metal films 56 to 58 and the metal layers 59 to 61, and the metal layer 53 is formed on the flat surface. Note that, similar to FIG. 2A, the metal layer 53 is an Al layer or an Al alloy layer and formed by a sputtering method, for example. In addition, the Cr layer composing the plating metal film 54 is also formed by a sputtering method, for example. Moreover, the barrier metal films 56 to 58 are made of refractory metal such as Ti or TiN and are also formed by a sputtering method, for example. The metal layers 59 to 61 are W layers and formed by a CVD method, for example. Further, the Cu plated layer 55 is formed by electrolytic plating while using the Cu layer composing the plating metal layer 54 as a seed.

With this structure, in the area where hatching is not performed, namely the area on the insulating layer 52 and the barrier metal films 56 to 58, the metal layer 53 has a tight crystal grain spacing. Accordingly, the crystal structure is thought to be the columnar crystal structure. On the other hand, in the area where sandy hatching is performed, namely the area on the metal layers 59 to 61, the metal layer 53 is thought to have a crystal structure with a random crystal orientation.

Further, in the area where hatching is not performed, namely the area above the insulating layer 52 and the barrier metal films 56 to 58, the Cr layer composing the plating metal layer 54 has a tight crystal grain spacing. Accordingly, the crystal structure is thought to be the columnar crystal structure. On the other hand, in the area where line hatching is performed, namely the area above the metal layer 59 to 61, the Cr layer is thought to have a crystal structure with a loose crystal grain spacing and a random crystal orientation.

The Cu plated layer 55 is formed on the Cr layer having both areas-the area with a loose crystal grain spacing and the area with a tight crystal grain spacing. As described above regarding the structure shown in FIG. 3(A), in the area with a loose crystal grain spacing in the Cr layer, shown by the line hatching, the spaces among the crystal grains in the Cr layer are widened. In the spaces among the crystal grains in the Cr layer, the Cu plated layer 55 reacts with the metal layer 53 formed of an Al layer or an Al alloy layer. Moreover, an alloy layer including Cu and Al is formed in the metal reaction area.

FIG. 4 shows an analysis picture of TEM for an area where line hatching is performed in the plating metal layer 23 shown in FIG. 3A. As shown in FIG. 4, an area above a black area crossing a central area of the analysis picture (the area indicated by a +mark 011) is the Cu plated layer 24. The black area crossing the central area of the analysis picture (the area indicated by a +mark 012) is the Cr layer. Moreover, an area ruptured in the black area crossing the central area of the analysis picture (the area indicated by a +mark 013) is the alloy layer. Furthermore, an area below the black area crossing the central area of the analysis picture (the area indicated by a +mark 014) is the second metal layer 19. As shown in FIG. 4, in the area having a loose crystal grain spacing in the Cr layer, the metals described above flows among the crystal grains in the Cr layer and the alloy layer formed by metal reaction ruptures the Cr layer. Moreover, the Cu plated layer 24 and the second metal layer 19 are connected to each other by the alloy layer.

In this event, although not for sure, the oxide film formed on the surface of second metal layer 19, when the metal reaction occurs, is slightly pushed to another area from the metal reaction area or is diffused and eliminated. Specifically, the area where the metal reaction occurs and the alloy layer including Cu and Al is formed has lower resistance than the area where the Cr layer exists between the Cu plated layer 24 and the second metal layer 19.

FIG. 5 shows an analysis picture of TEM for an area where hatching is not performed in the plating metal layer 23 shown in FIG. 3A. As shown in FIG. 5, a black area above an area crossing a central area of the picture in a striped pattern (the black area indicated by a +mark 001) is the Cu plated layer 24. An area immediately above the area crossing the central area of the picture in the striped pattern (the area indicated by a +mark 002) is a boundary area between the Cu plated layer 24 and the Cr layer. An area crossing the central area of the picture in the striped pattern (the area indicated by a +mark 003) is the Cr layer. An area immediately below the area crossing the central area of the picture in the striped pattern (the area indicated by a +mark 004) is a boundary area between the Cr layer and the second metal layer 19. A white area below the area crossing the central area of the picture in the striped pattern (the white area indicated by a +mark 006) is the second metal layer 19. As shown in FIG. 5, the crystal grains in the Cr layer are in a columnar crystal state. Moreover, the Cr layer is in a dense state so that the crystal grains come into contact with each other. Thus, the Cu plated layer 24 and the second metal layer 19 are separated by the Cr layer without reacting with each other through the spaces between the crystal grains in the Cr layer. Note that, in the area indicated by the +mark 004, the oxide film formed on the surface of the second metal layer 19 is also observed.

In the area having a tight crystal grain spacing in the Cr layer, the oxide film on the surface of the second metal layer 19 and the Cr layer allow resistance to be set higher than in the area where the metal reaction occurs and the alloy layer exists.

In other words, the Cu plated layer 24 is connected to the second wiring layer 20 above the opening regions 8 to 12 which connect the first wiring layer 3 to the second wiring layer 20. In this structure, the current between the second wiring layer 20 and the Cu plated layer 24 mainly flows through the region, as a current path, where the alloy layer including Cu and Al is formed above the opening regions 8 to 12. As described above, the area where the crystal grain spacing is loose in the Cr layer and where the alloy layer is formed has lower resistance than the area where the crystal grain spacing in the Cr layer is tight. Consequently, a connection resistance value between the second wiring layer 20 and the Cu plated layer 24 is reduced.

Note that, the case where the plating metal layer 23 and the Cu plated layer 24 form the wiring layer is described in this embodiment, but this embodiment of the present invention is not limited to this case. For example, instead of the plating metal layer 23, a barrier metal film made of refractory metal such as Ti or TiN and formed by a sputtering method or the like may be used, and, instead of the Cu plated layer 24, a Cu layer formed by a sputtering method or the like may be used. In this structure, an alloy layer including Cu and Al is formed through the area having a loose crystal grain spacing in the barrier metal film, and the oxide film on the second metal layer 19 is diffused and eliminated, and thus the connection resistance value between the second wiring layer 20 and the Cu layer is reduced as well. In addition, instead of the spin coated resin film 21, an insulating layer such as a silicon oxide film and a TEOS film may be formed.

Moreover, the connection structure between the wiring layer formed of the Cu plated layer 24 and the second wiring layer 20 whose main metal material is an Al layer or an Al alloy layer is described in this embodiment, but this embodiment of the present invention is not limited to this case. For example, as shown in FIGS. 2B and 2C, the region of the wider wiring width may be used as an electrode to reduce the connection resistance value between the electrode and the Cu plated layer. In this structure, the W layer is embedded in the opening regions provided below the electrode, the Al layer or the Al alloy layer composing the electrode reacts with the Cu plated layer, and thus the alloy layer is formed above the electrode. Consequently, the same effect can be obtained.

Furthermore, the structure in which the wiring layers formed of the first wiring layer 3, the second wiring layer 20 and the Cu plated layer 24 is formed above the insulating layer 2 is described in this embodiment, but this embodiment of the present invention is not limited to this case. For example, a wiring layer whose main metal material is an Al layer or an Al alloy layer may be further formed in the insulating layer 2 to form a multi-wiring layer structure. Moreover, the first wiring layer 3 and a diffusion region of a semiconductor element, formed on the silicon substrate 1, may be electrically connected to each other through the opening regions formed in the insulating layer 2. Various other modifications can also be made without departing from the scope of the present invention.

Next, with reference to FIGS. 6 to 9, a manufacturing method of a semiconductor device according to an embodiment of the present invention will be described in detail. FIGS. 6 to 9 are cross-sectional views which illustrate the manufacturing method of the semiconductor device according to the embodiment. Since the manufacturing method of the structure shown in FIG. 1A will be described, the same structure members are denoted by the same reference numerals in this embodiment.

Figure 6:
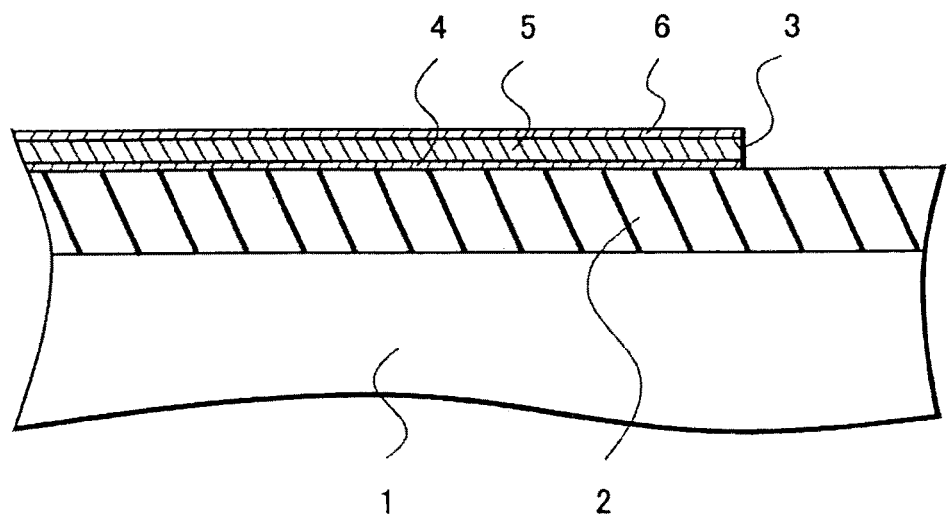
FIG. 6 is a cross-sectional view which illustrates a manufacturing method of a semiconductor device according to the embodiment of the present invention.

As shown in FIG. 6, a silicon substrate (wafer) 1 is prepared, and an insulating layer 2 is formed on the silicon substrate 1. As the silicon substrate 1, a single crystal substrate or an epitaxial layer formed on a single crystal substrate can be used. Alternatively, the silicon substrate 1 may be a compound semiconductor substrate. As might be expected, a semiconductor element includes the diffusion region on the silicon substrate 1 (including the epitaxial layer when the epitaxial layer is formed). Moreover, the insulating layer 2 is formed of one or more layers selected from a silicon dioxide film, an NSG film and a BPSG film, for example. The insulating layer 2 is formed by, for example, a thermal oxidation method or a CVD method.

A first wiring layer 3 is formed on the insulating layer 2. Specifically, refractory metal such as Ti or TiN is deposited, as a barrier metal film 4, above the silicon substrate 1 by a sputtering method, for example. Sequentially, above the silicon substrate 1, an Al film or an Al alloy film, one or more components of which are selected from an Al—Si film, an Al—Si—Cu film, an Al—Cu film, and the like is deposited as a metal film 5 by a sputtering method, for example. Furthermore, refractory metal such as TiN or TiW is sequentially deposited, as an antireflection coating 6, above the silicon substrate 1 by a sputtering method, for example. Thereafter, the barrier metal film 4, the metal film 5 and the antireflection coating 6 are selectively removed by a photolithography technique and an etching technique to form a first wiring layer 3.

Figure 7:
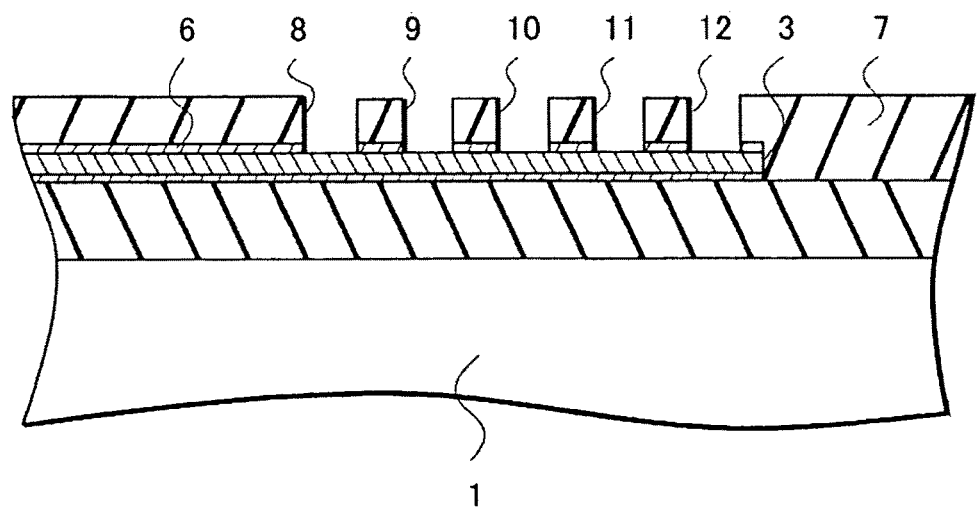
FIG. 7 is a cross-sectional view which illustrates the manufacturing method of the semiconductor device according to the embodiment of the present invention.

Next, as shown in FIG. 7, a first insulating layer 7 is formed above the silicon substrate 1 as well as on the first wiring layer 3. A silicon oxide film, a TEOS film, or the like is formed, as the first insulating layer 7, by a CVD method, for example. Subsequently, opening regions 8 to 12 are formed in the antireflection coating 6 on the first wiring layer 3 and in the first insulating layer 7 above the first wiring layer 3 by a photolithography technique and an etching technique. The opening regions 8 to 12 are formed by dry etching using, for example, $CHF_3$ or $CF_4$ gas.

Figure 8:
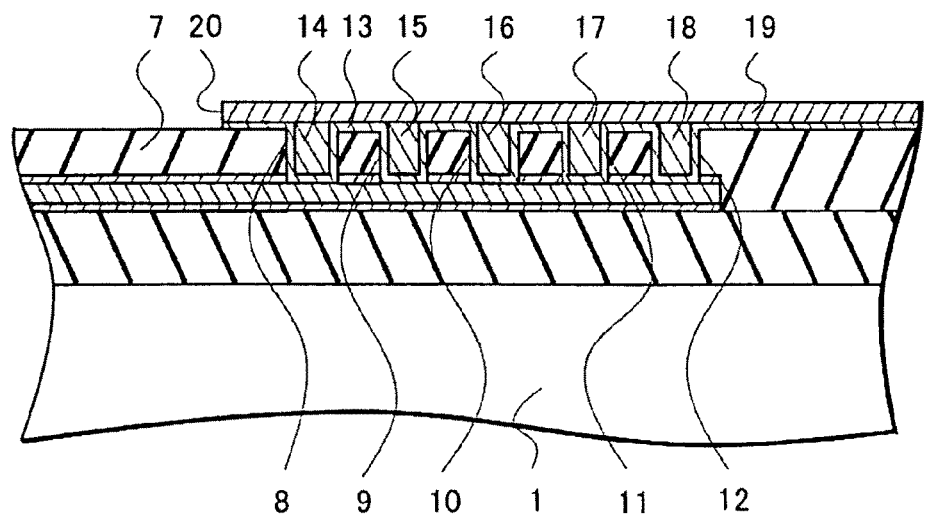
FIG. 8 is a cross-sectional view which illustrates the manufacturing method of the semiconductor device according to the embodiment of the present invention.

As shown in FIG. 8, refractory metal such as Ti or TiN is deposited, as a barrier metal film 13, above the silicon substrate 1 including the opening regions 8 to 12 by a sputtering method, for example. After a W layer is deposited, as a first metal layer 14 to 18, above the silicon substrate 1 by a CVD method, for example, an etchback process is performed, and then the barrier metal film 13 and the first metal layers 14 to 18 are embedded in the opening regions 8 to 12. Next, an Al layer or an mainly-aluminous alloy layer, at least which is selected from an Al—Si film, or an Al—Si—Cu film, or an Al—Cu film, or the like is deposited, as a second metal layer 19, above the silicon substrate 1 by a sputtering method, for example. Thereafter, the above described barrier metal film 13 and the second metal layer 19 are selectively removed by a photolithography technique and an etching technique to form a second wiring layer 20.

Note that, an antireflection coating made of refractory metal such as TiN or TiW may be formed on the second metal layer 19 formed of an Al layer or an alloy layer as needed.

Figure 9:
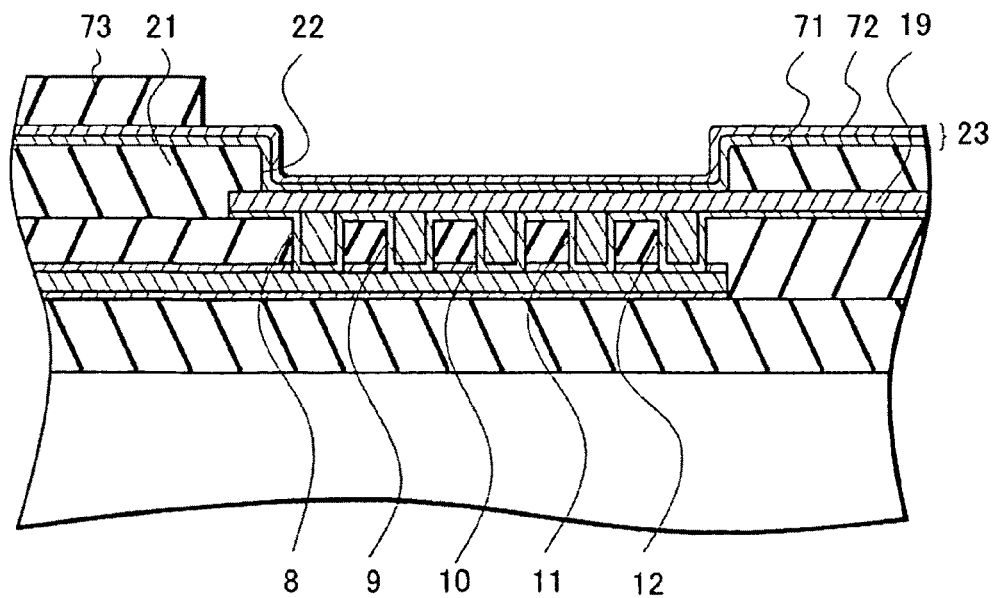
FIG. 9 is a cross-sectional view which illustrates the manufacturing method of the semiconductor device according to the embodiment of the present invention.

As shown in FIG. 9, a spin coated resin film 21 is formed above the silicon substrate 1 by using, for example, a spin-coating method. As the material, a PBO film, a polyimide resin film or the like is used. Subsequently, an opening 22 is formed, above the region where the opening regions 8 to 12 are formed, in the spin coated resin film 21 on the second metal layer 19, by the photolithography technique and an etching technique. The second metal layer 19 is exposed at the opening 22. Note that, in the steps of forming the opening 22 in the spin coated resin film 21, an oxide film with a thickness of approximately 3 nm is formed on the surface of the second metal layer 19.

Next, a Cr layer 71 and a Cu layer 72 are deposited entirely above the silicon substrate 1 by a sputtering method, for example. By using the Cr layer 71 as the plating metal layer 23, the adhesion between the PBO film and a Cu plated layer 24 (see FIG. 10) improves. Subsequently, to pattern the Cu plated layer 24, a photoresist layer 73 is formed on the region where the Cu plated layer 24 is not formed.

Figure 10:
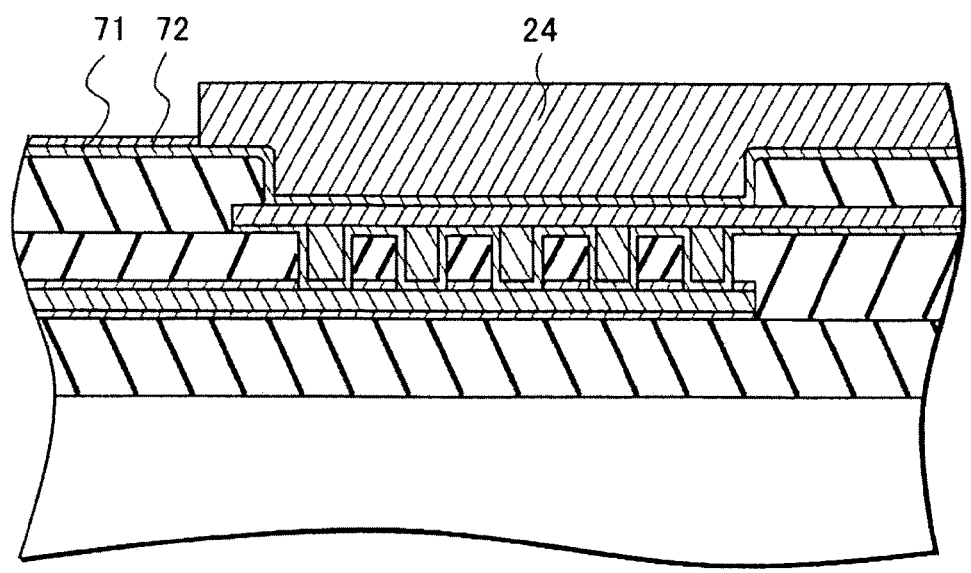
FIG. 10 is a cross-sectional view which illustrates the manufacturing method of the semiconductor device according to the embodiment of the present invention.
Figure 11:
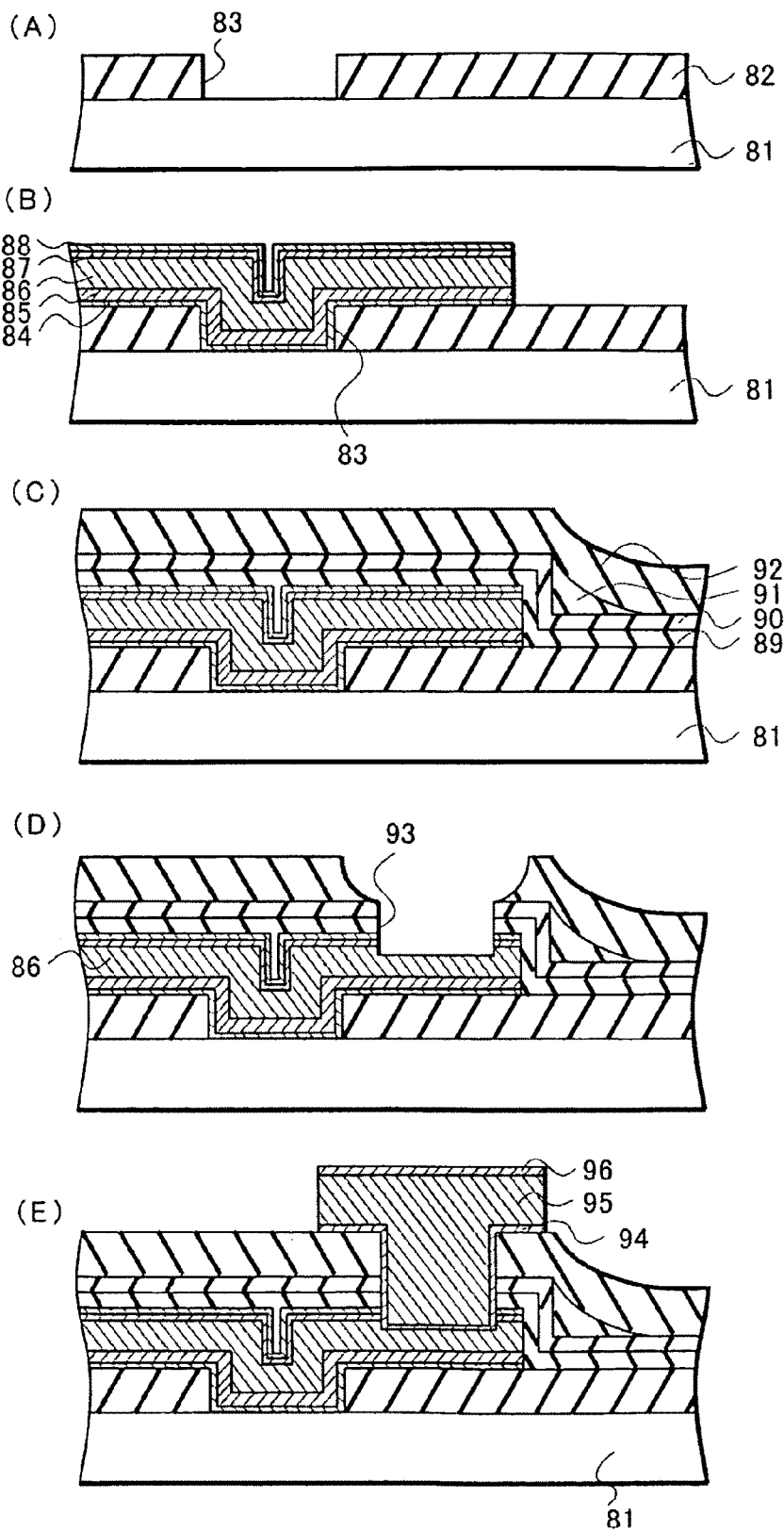
FIGS. 11A to 11E are cross-sectional views which illustrate a manufacturing method of a semiconductor device according to a conventional embodiment.
Figure 12:
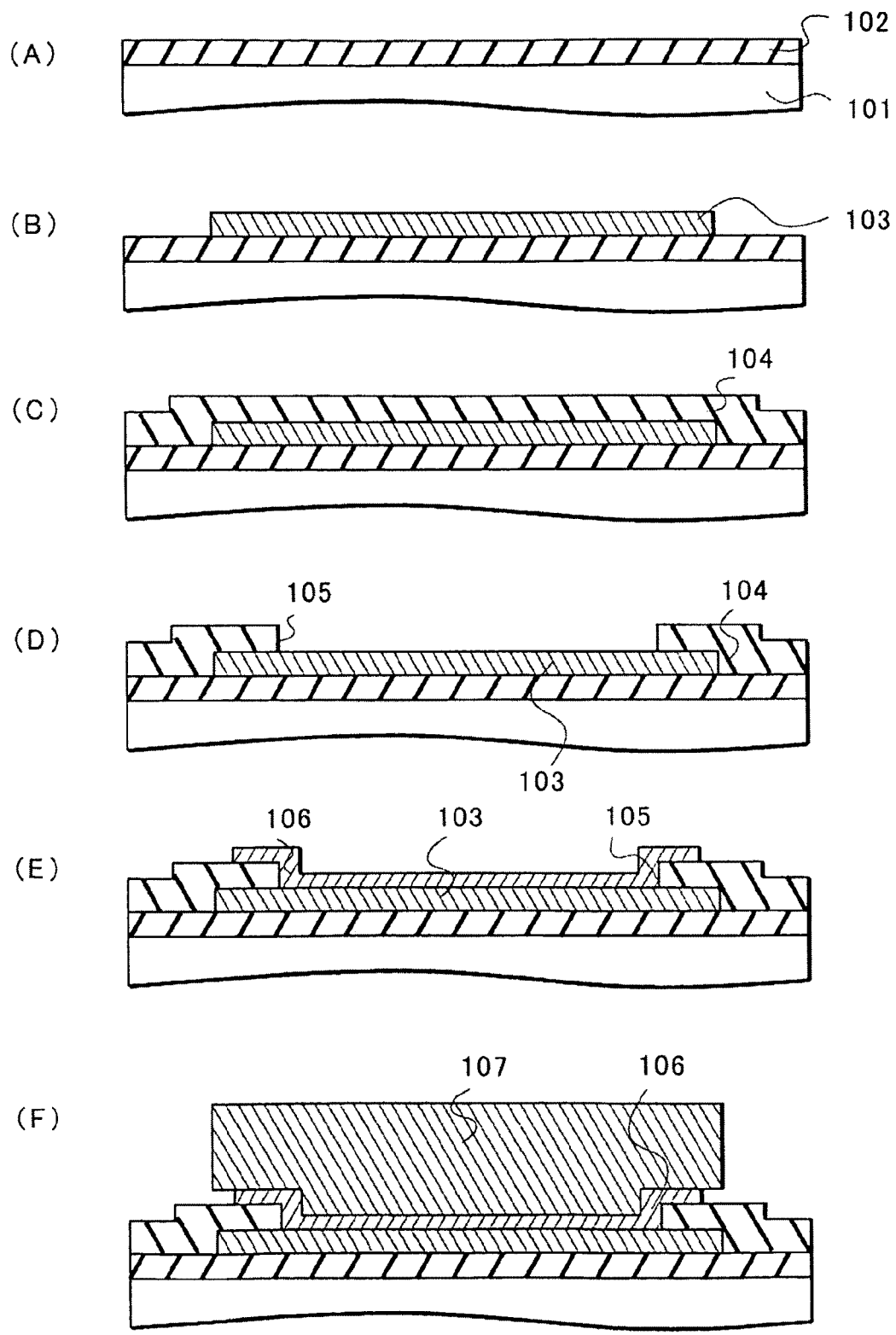
FIGS. 12A to 12F are cross-sectional views which illustrate another manufacturing method of a semiconductor device according to a conventional embodiment.

As shown in FIG. 10, the Cu plated layer 24 is formed by electrolytic plating. As described above, the Cr layer 71 is used as a seed layer, and the Cu layer 72 is used as a seed for electrolytic plating.

The Cu plated layer 24 on the Cr layer 71 and the Cu layer 72 is patterned by removing the above-described photoresist layer 73. Furthermore, the Cr layer 71 and the Cu layer 72 are selectively removed by wet etching using the Cu plated layer 24 as a mask. This completes the structure shown in FIG. 1A. Note that, although not illustrated, the structure may be formed into the one shown in FIG. 1B by further forming a PBO film and a bump electrode 27 (see FIG. 1B) on the Cu plated layer 24.

Note that, by electrolytic plating, although the Cu plated layer 24 is formed above the plating metal layer 23, the Cu layer 72 is practically transformed into the Cu plated layer 24. For this reason, the Cu layer 72 is integrally shown with the Cu plated layer 24, and only the Cr layer 71 is shown.

In this embodiment, described is the case of preparing the wafer, and then forming, on the wafer, the insulating layer 2, the first wiring layer 3, the first insulating layer 7, the opening regions 8 to 12, the barrier metal film 13, the first metal layers 14 to 18, the second metal layer 19. However, this embodiment of the present invention is not limited to the case. For example, the wafer on which the insulating layer 2, the first wiring layer 3, the first insulating layer 7, the opening regions 8 to 12, the barrier metal film 13, the first metal layer 14 to 18, the second metal layer 19 are already formed is prepared, and the spin coated resin film 21, the opening 22, the plating metal layer 23, the Cu plated layer 24, the bump electrode 27 and the like may be formed on the wafer.

In this embodiment, also described is the case of depositing the Cu layer 72 on the Cr layer 71 as the plating metal layer 23 (see FIG. 9), but this embodiment of the present invention is not limited to the case. For example, as the plating metal layer 23, a Ti layer or a TiW layer may be used instead of the Cr layer 71, and an Ni layer may be formed instead of the Cu layer 72. When an Ni layer is used, an Au plated layer, instead of the Cu plated layer, may be formed on the Ni layer.

In this embodiment, also described is the case of forming the plating metal layer 23 and the Cu plated layer 24 on the opening 22 and the spin coated resin film 21, but this embodiment of the present invention is not limited to the case. For example, a barrier metal film made of refractory metal such as Ti or TiN may be formed, instead of the plating metal layer 23, by a sputtering method, for example, and a Cu layer may be formed, instead of the Cu plated layer 24, by a sputtering method, for example. With this manufacturing method, an alloy layer including Cu and Al is formed through the coarse areas (the areas having a loose crystal grain spacing) in the barrier metal film, and the oxide film on the second metal layer 19 is diffused and eliminated, and thus, the connection resistance value between the second wiring layer 20 and the Cu layer is reduced as well. Various other modifications can also be made without departing from the scope of the present invention.

In this embodiment of the invention, the alloy layer made of metal composing the first and the second wiring layers is formed in the region where the upper and the lower layers of the wiring layers are connected to each other. The connection resistance value is reduced because the alloy layer serves as a current path.

In addition, in this embodiment of the invention, the metal layer formed by a sputtering method is deposited on the metal layer formed by a CVD method in the region where the upper and the lower layers of the wiring layers are connected to each other. With this structure, the region where the wiring layers are connected to each other allows the alloy layer to be easily formed.

Moreover, in this embodiment of the invention, the use of a chrome layer as the plating metal layer improves the adhesion between the polybenzoxazole film and the wiring layer.

Furthermore, in this embodiment of the invention, the use of the polybenzoxazole film or the polyimide resin film as the spin coated resin film prevents the deterioration of the semiconductor element caused by the external environment such as moisture.

Moreover, in this embodiment of the invention, the alloy layer is formed by metal reaction between an aluminum layer or an aluminum alloy layer and a copper layer. The both metal layers have an affinity with each other and easily react with each other in a coarse area (the area having a loose crystal grain spacing) of the chrome layer. Thus, the resistance value on the pad electrode is reduced.

What is claimed is:

1. A semiconductor device comprising:
a first wiring layer disposed on a semiconductor substrate;
a first insulating layer disposed on the first wiring layer and having a first opening formed therein;
a first metal layer embedded in the first opening so as to be connected to the first wiring layer;
a second wiring layer disposed on the first insulating layer so as to be connected to the first metal layer;
a second insulating layer disposed on the second wiring layer and the first insulating layer and having a second opening formed therein, the second opening covering the first opening;
a third wiring layer disposed on the second insulating layer so as to be connected to the second wiring layer through the second opening; and
an alloy layer disposed between the second and third wiring layers and made of metals of the second and third wiring layers, the alloy layer being formed non-uniformly between the second and third wiring layers so that the alloy layer is formed above the first opening but is not formed horizontally away from the first opening.

2. The semiconductor device of claim 1, wherein the second wiring connected to the first metal layer is configured to operate as an electrode.

3. A semiconductor device comprising:
a first wiring layer disposed on a semiconductor substrate;
a first insulating layer disposed on the first wiring layer and having a first opening formed therein;
a first metal layer embedded in the first opening so as to be connected to the first wiring layer;
a second wiring layer disposed on the first insulating layer so as to be connected to the first metal layer;
a second insulating layer disposed on the second wiring layer and the first insulating layer and having a second opening formed therein, the second opening covering the first opening;
a third wiring layer disposed on the second insulating layer so as to be connected to the second wiring layer through the second opening; and
an alloy layer disposed between the second and third wiring layers and made of metals of the second and third wiring layers,
wherein the third wiring layer comprises a chromium layer and a copper layer disposed on the chromium layer, grains of a first portion of the chromium layer located directly above the first metal layer are more loosely packed than grains of a second portion of the chromium layer located not directly above the first metal layer so that the grains of the first portion have wider spaces between them than the grains of the second portion, and the alloy layer is formed in the wider spaces among the grains of the first portion of the chromium layer.

4. The semiconductor device of claim 3, wherein the second wiring layer comprises a barrier metal layer and a second metal layer formed on the barrier metal layer, in the first opening the barrier metal layer is disposed at a bottom of the first opening with the first metal layer covering the barrier metal layer, the second metal layer is in contact with the first metal layer, and the first portion of the chromium layer is in contact with the second metal layer in contact with the first metal layer.

5. The semiconductor device of claim 4, wherein the first metal layer comprises tungsten, and the second metal layer comprises aluminum or an aluminum alloy.

6. The semiconductor device of claim 5, wherein the copper layer in the third wiring layer comprises a copper plated layer.

7. The semiconductor device of claim 4, wherein the second insulating layer comprises a polybenzoxazole film or a polyimide resin film.

8. The semiconductor device of claim 3, wherein the second wiring connected to the first metal layer is configured to operate as an electrode.

9. A semiconductor device comprising:
a first wiring layer disposed on a semiconductor substrate;
a first insulating layer disposed on the first wiring layer and having a plurality of first openings formed therein;
a barrier metal film comprising titanium, covering bottoms and sidewalls of the first openings and covering a top portion of the first insulating layer;
a plurality of first metal layers comprising tungsten and embedded in corresponding first openings covered by the barrier metal film;
a second metal layer comprising aluminum and in contact with the first metal layers embedded in the first openings and in contact with the barrier metal layer disposed on the top portion of the first insulating layer;
a second insulating layer disposed on the second metal layer and the first insulating layer and having a second opening formed therein, the second opening covering the first openings;
a third metal layer comprising chromium disposed in the second opening so as to be in contact with the second metal layer; and
a fourth metal layer comprising copper and in contact with the third metal layer in the second opening,
wherein an alloy layer made of the metals of the second and fourth metal layers is formed non-uniformly in the third metal layer so that the alloy layer is formed above the first opening but is not formed horizontally away from the first opening.

* * * * *